United States Patent
Huang et al.

[19]

[11] Patent Number: 6,023,205

[45] Date of Patent: Feb. 8, 2000

[54] CIRCUIT ARRANGEMENT FOR REDUCING PASSBAND RIPPLE OF A BANDPASS FILTER

[75] Inventors: Guanghua Huang, Hutchinson; Kimmo Antero Kyllonen, Clearwater, both of Minn.

[73] Assignee: ADC Solitra, Inc., Hutchinson, Minn.

[21] Appl. No.: 09/012,264

[22] Filed: Jan. 23, 1998

[51] Int. Cl.[7] ........................................... H01P 1/20
[52] U.S. Cl. .................... 333/202; 333/134; 333/222; 455/307; 455/311
[58] Field of Search ..................... 333/175, 176, 333/206, 207, 134, 222, 223; 455/78, 83, 307, 311

[56] References Cited

U.S. PATENT DOCUMENTS

| | | | |
|---|---|---|---|
| 3,747,030 | 7/1973 | Walding | 333/206 |
| 4,100,504 | 7/1978 | McGann | 331/39 |
| 4,804,962 | 2/1989 | Picquendar | 455/311 X |
| 4,816,788 | 3/1989 | Ishikawa et al. | 333/203 |
| 5,159,711 | 10/1992 | Ma et al. | 455/307 |
| 5,406,235 | 4/1995 | Hayashi | 333/204 |
| 5,410,538 | 4/1995 | Roche et al. | 370/18 |
| 5,554,960 | 9/1996 | Ohnuki et al. | 333/133 X |
| 5,630,225 | 5/1997 | Corman | 455/307 X |
| 5,703,545 | 12/1997 | Dullberg et al. | 333/175 X |
| 5,774,027 | 6/1998 | Yamamoto | 333/175 X |

*Primary Examiner*—Seungsook Ham
*Attorney, Agent, or Firm*—Merchant & Gould P.C.

[57] ABSTRACT

A bandpass filter arrangement that includes a weakly coupled coaxial resonator to reduce the fluctuation in frequency response of the filter arrangement. A bandpass filter is coupled to the output of a low noise amplifier. The characteristic fluctuation in frequency response in the passband of the bandpass filter is reduced with a coaxial resonator that is disposed proximate the filter arrangement.

24 Claims, 5 Drawing Sheets

CIRCUIT ARRANGEMENT FOR REDUCING PASSBAND RIPPLE OF A BANDPASS FILTER

FIELD OF THE INVENTION

The present invention relates generally to radio wave filtering circuit arrangements, and more particularly to reducing passband ripple in such filter arrangements.

BACKGROUND

Radio frequency (RF) equipment uses a variety of approaches and structures for receiving and transmitting radio waves in selected frequency bands. Typically, filtering structures are used to maintain proper communication in frequency bands assigned to a particular band. The type of filtering structure used often depends upon the intended use and the specifications for the radio equipment. For example, dielectric and coaxial cavity resonator filters are often used for filtering electromagnetic energy in certain frequency bands, such as those used for cellular and PCS communications.

The "ripple" of a radio wave filter arrangement is defined as the fluctuation of the frequency response in the passband of the filter of the filter arrangement. Various Coded Division Multi-Access (CDMA) cellular telephone applications require the ripple of a filter arrangement to be less than a predetermined level, such as 0.5 dB within a continuous bandwidth of 1.23 MHz or 2 MHz in passband.

A prior approach for reducing the ripple of a filter arrangement uses a filter having a relatively large Q factor. However, this approach requires a larger resonator cavity for the filter, along with a sophisticated design and production process. Therefore, while other designs may effectively reduce the ripple of a filter arrangement, they do so with accompanying additional expenses resulting from added design and production costs. A filter arrangement that addresses the above identified problems would therefore be desirable.

SUMMARY OF THE INVENTION

According to one embodiment, the present invention is directed to a filter arrangement for reducing passband ripple of a bandpass filter. The circuit arrangement comprises: a signal amplifier having an output port and arranged to receive an input signal; an electrical path coupled to the output port of the amplifier; a filter coupled to the electrical path; and a coaxial resonator coupled to the electrical path.

In another embodiment, the filter arrangement comprises: a signal amplifier arranged to receive an input signal; a filter coupled to the amplifier, the filter having a recess; and a coaxial resonator having a terminal disposed within the recess of the filter.

In a third embodiment, the filter arrangement comprises: a signal amplifier arranged to receive an input signal; a filter coupled to the amplifier and having an output port; an electrical path coupled to the output port of the filter; and a coaxial resonator coupled to the electrical path.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Other aspects and advantages of the invention will become apparent upon reading the following detailed description and upon reference to the drawings in which.

Figure 1:
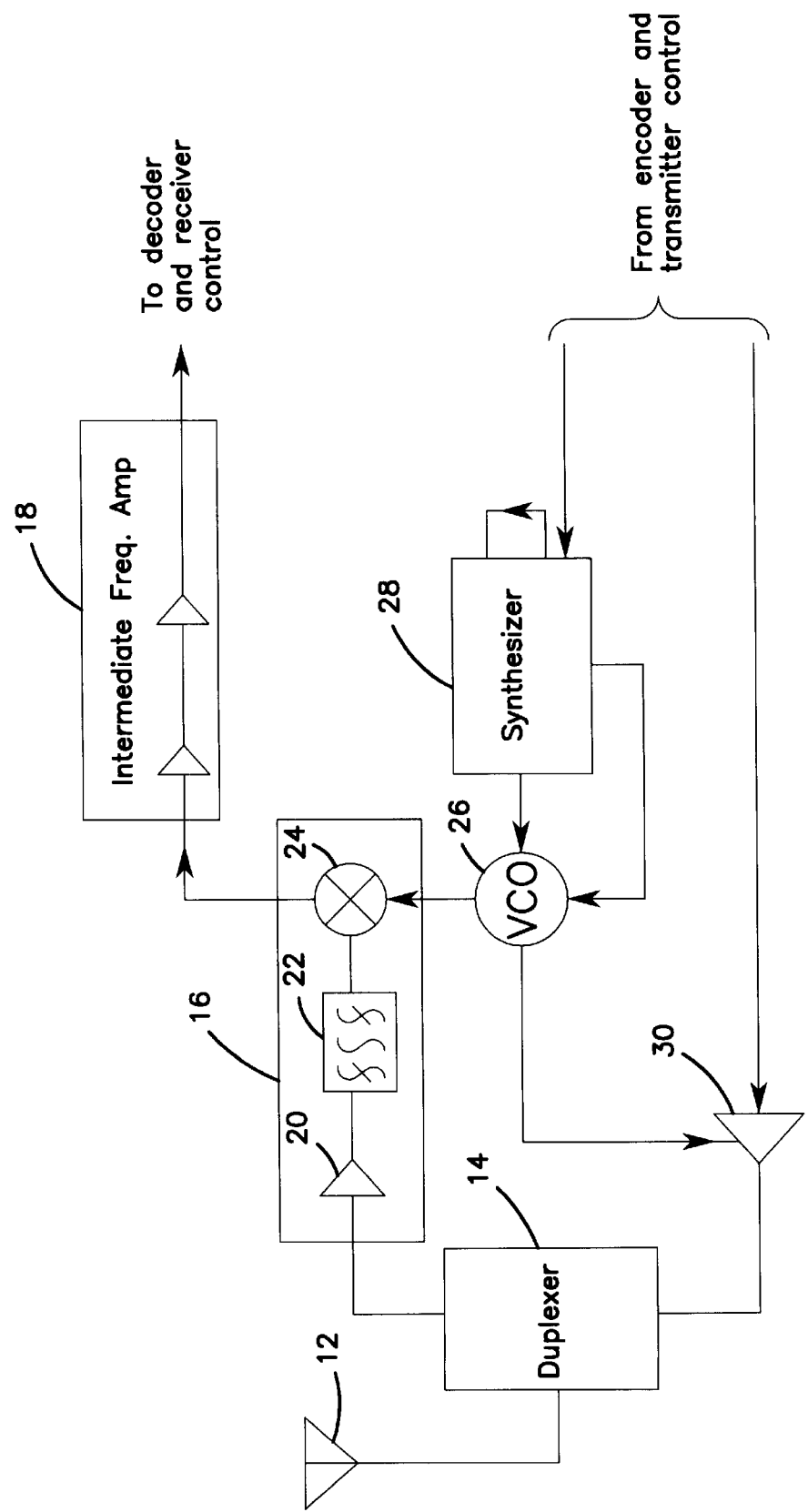
FIG. 1 is a block diagram of a circuit arrangement providing duplexed reception and transmission of radio signals in accordance with the present invention.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of radio frequency (RF) applications in which achieving a low ripple in the passband is desirable. The present invention has been found to be particularly applicable and beneficial in cellular-communication applications. While the present invention is not so limited, an appreciation of the present invention is best presented by way of a particular example application, in this instance, in the context of cellular communication.

FIG. 1 is a block diagram of an example circuit arrangement, according to one implementation and application of the present invention, providing duplexed reception and transmission of radio signals. The system of FIG. 1 includes both receive and transmit circuitry for use in various communication arrangements, such as a cellular telephone arrangement. It will be appreciated that the receive circuitry of FIG. 1 is suitable for both mobile and base portions of an example cellular telephone arrangement. Other embodiments of the invention are also suitable for use in various other systems having only receive circuitry, such as satellite receivers.

The arrangement of FIG. 1 includes an antenna 12 coupled to a duplexer 14. Receive circuitry includes a converter 16, implemented in a manner consistent with FIG. 2, coupled to receive radio signals from duplexer 14 and an intermediate frequency amplifier 18 coupled to the output of converter 16. Intermediate frequency amplifier provides as output amplified signals having a predetermined frequency.

Converter 16 includes a low-noise amplifier 20 that receives input radio signals from duplexer 14. The amplified signals are provided to bandpass filter 22, and the remaining signals are input to mixer 24. Mixer 24 receives the input radio signals and signals from voltage controlled oscillator 26, and provides signals having an intermediate frequency to amplifier 18. Voltage controlled oscillator 26 receives signals from synthesizer 28, which, for example, includes a phase-locked loop to lock a desired frequency.

Transmit circuitry includes, in brief, an amplifier that receives signals for transmission, along with signals from voltage controlled oscillator 26. The output of amplifier 30 is provided to duplexer 14. While only an amplifier is shown, it will be recognized that typical transmit circuitry conventionally includes additional mixers, amplifiers, and filters to suit a particular application.

Figure 2:
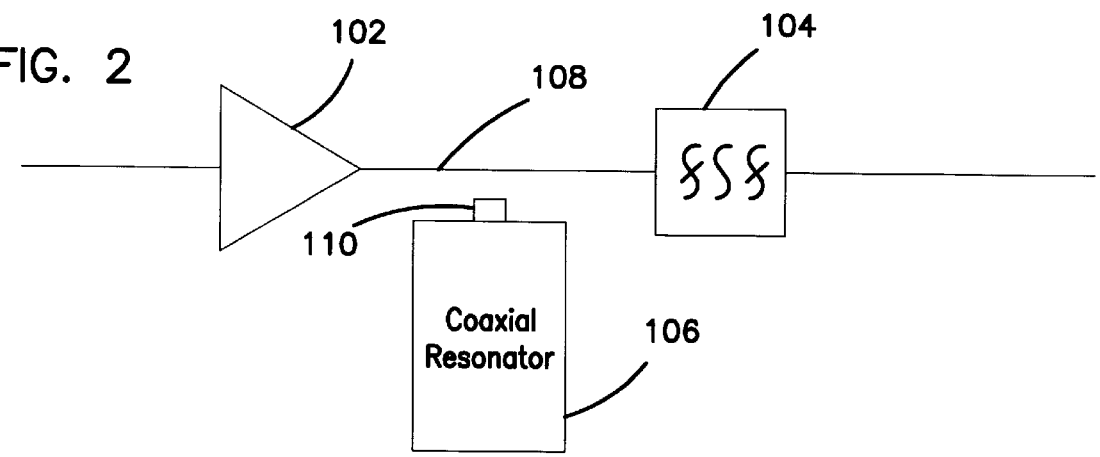
FIG. 2 is a circuit schematic of a filter arrangement according to an embodiment of the present invention.

FIG. 2 is a circuit schematic of a filter arrangement according to a first embodiment of the present invention. The example filter arrangement can be used, for example, in the receive circuit illustrated in FIG. 1. Specifically, The filter arrangement includes a low-noise amplifier 102, a bandpass filter 104, and a coaxial resonator 106. Amplifier 102 is selected according to system requirements for signal amplification, such as, for example a low-noise amplifier. Filter 104 is a bandpass filter that is coupled to low-noise amplifier 102 via electrical path 108. Electrical path 108 is, for example, a metallic trace on a printed circuit board. An example bandpass filter 104 is the GMF 91107 filter that is commercially available from ADC SOLITRA.

Bandpass filter 104 has a characteristic ripple its passband frequency, thereby introducing a phase error. To reduce the ripple, coaxial resonator 106 is disposed near electrical path 108. More particularly, an example coaxial resonator 106 has a terminal 110 that is disposed near electrical path 108. This creates a "weak" coupling between coaxial resonator 106 and electrical path 108. The coupling is weak in the sense that coaxial resonator 106 is located proximate electrical path 108 but not directly connected thereto. Because coaxial resonator 106 resonates at a certain frequency, it absorbs signal energy in a given frequency range. A network analyzer shows that at electrical path 108 and at the output of filter 104, an absorption notch is present.

The separation between terminal 110 of coaxial resonator 106 and electrical path 108 depends upon the required level of absorption. For example, where a 0.7 dB absorption is required, a coaxial resonator having a Q factor of approximately 300 has its terminal disposed 0.4 mm. from electrical path 108, where electrical path 108 has a characteristic impedance of 50 Ohms.

In an example application, coaxial resonator 106 has a relatively low Q factor, for example, between about 200 and 400. An example coaxial resonator 106 is commercially available from sources such as Murata Manufacturing Company, Ltd. of Japan and Trans-Tech, Inc.

Figure 3:
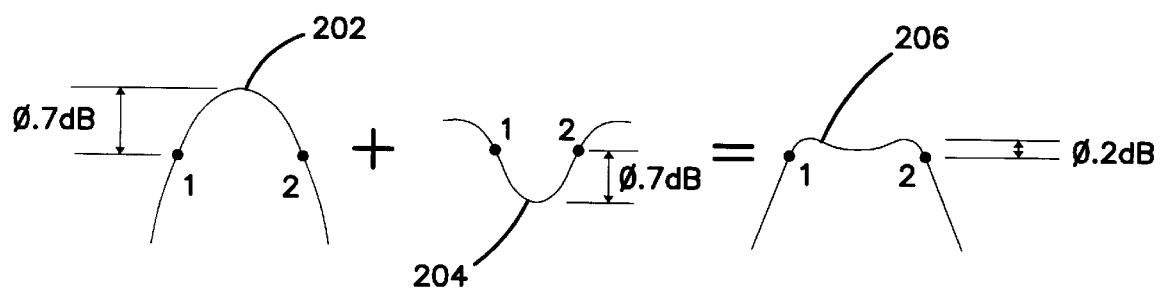
FIG. 3 illustrates the principle of the present invention with frequency responses of an uncompensated filter arrangement, an electrical path with a weakly coupled coaxial resonator, and a filter arrangement including a coaxial resonator weakly coupled to an electrical path.

FIG. 3 illustrates the principle of the present invention with frequency responses of an uncompensated filter arrangement, an electrical path with a weakly coupled coaxial resonator, and a filter arrangement including a coaxial resonator weakly coupled to an electrical path. Specifically, curve 202 illustrates a portion of a frequency response curve for an example bandpass filter, where the curve is displayed by a network analyzer that is connected to the input and output of a filter having no coaxial resonator weakly coupled to the electrical path. Markers 1 and 2 on curve 202 mark the start and stop frequencies for the passband. In the example, frequency response curve 202 fluctuates by 0.7 dB within the passband. The example frequency response curve for the uncompensated filter is illustrative of a filter arrangement for which ripple has not been compensated.

Curve 204 illustrates a portion of the frequency response of a coaxial resonator that is weakly coupled to an electrical path, where the curve is generated from a network analyzer that is connected to the electrical path at a point before the coaxial resonator and at a point after the coaxial resonator, but before a filter. For example, curve 204 illustrates the frequency response between the passband as marked by markers 1 and 2 for coaxial resonator 106 coupled to electrical path 108, as illustrated in FIG. 1. The example frequency response for coaxial resonator 106 is −0.7 dB, relative to markers 1 and 2. The combination of the characteristic frequency response of an example filter, as shown by curve 202, and the characteristic frequency response of an example coaxial resonator as illustrated by curve 204, is illustrated as curve 206. Curve 206 illustrates an estimated ripple of 0.2 dB for an example filter arrangement having a coaxial resonator weakly coupled to an electrical path servicing a filter. Thus, the ripple is reduced by approximately 0.5 dB.

Figure 4:
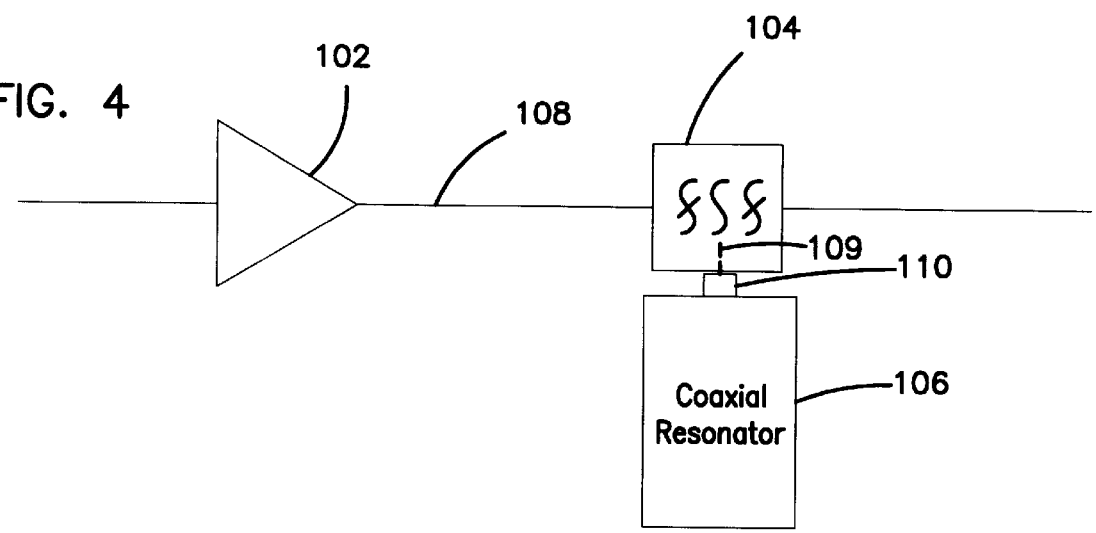
FIG. 4 illustrates a circuit arrangement according to another embodiment of the present invention.

FIG. 4 is a circuit schematic of a filter arrangement according to a second embodiment of the invention. As compared to the embodiment of FIG. 1, coaxial resonator 106 is coupled to filter 104 as compared to the embodiment of FIG. 1 where coaxial resonator 106 is coupled to electrical path 108. To accommodate the coupling of coaxial resonator 106 to filter 104, filter 104 includes a recess into which terminal 110 of coaxial resonator 106 is disposed. The recess in filter 104 is formed in a conventional manner, such as, for example, drilling or otherwise forming a hole (not shown) in filter 104.

In an example embodiment, a wire, shown as dashed line 109, is soldered to terminal 110 of coaxial resonator 106, and the wire is disposed within the recess of filter 104. With this approach, it is difficult to control the desired reduction in ripple. Some experimentation is required to determine the proper length of wire along with its placement within the recess of filter 104. Whereas, with the embodiment of FIG. 1, the circuit behavior can be simulated.

Figure 5:
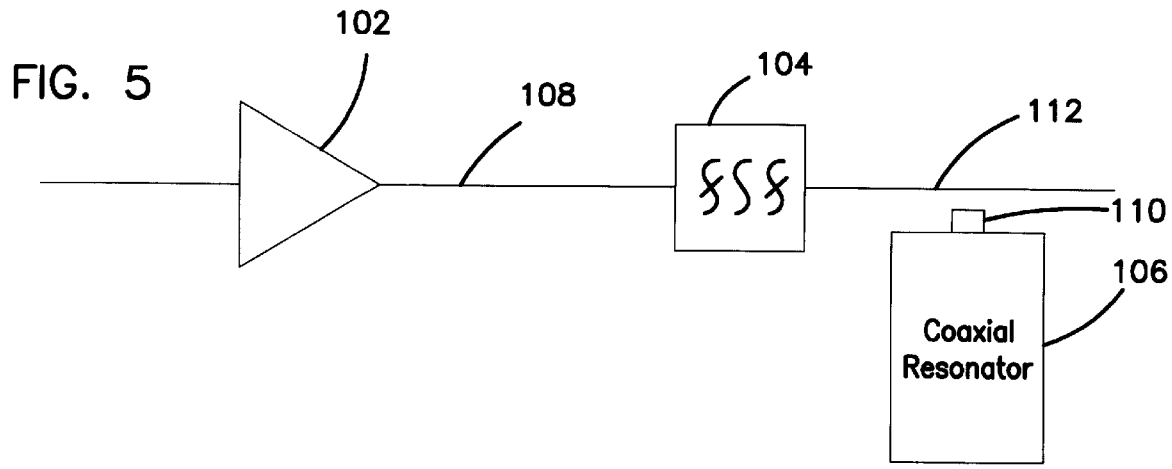
FIG. 5 illustrates yet another embodiment of the present invention.

FIG. 5 is a circuit schematic of a filter arrangement according to a third embodiment of the invention. The embodiment of FIG. 3 is similar to that of FIG. 1. However, coaxial resonator 106 is weakly coupled to electrical path 112 which is in turn coupled to the output of filter 104. In an example application, desired reduction in ripple is achieved using an electrical path 112 with a characteristic impedance of 50 Ohms. Applications that require a different level of reduction of ripple, may require an electrical path having different characteristics.

Figure 6:
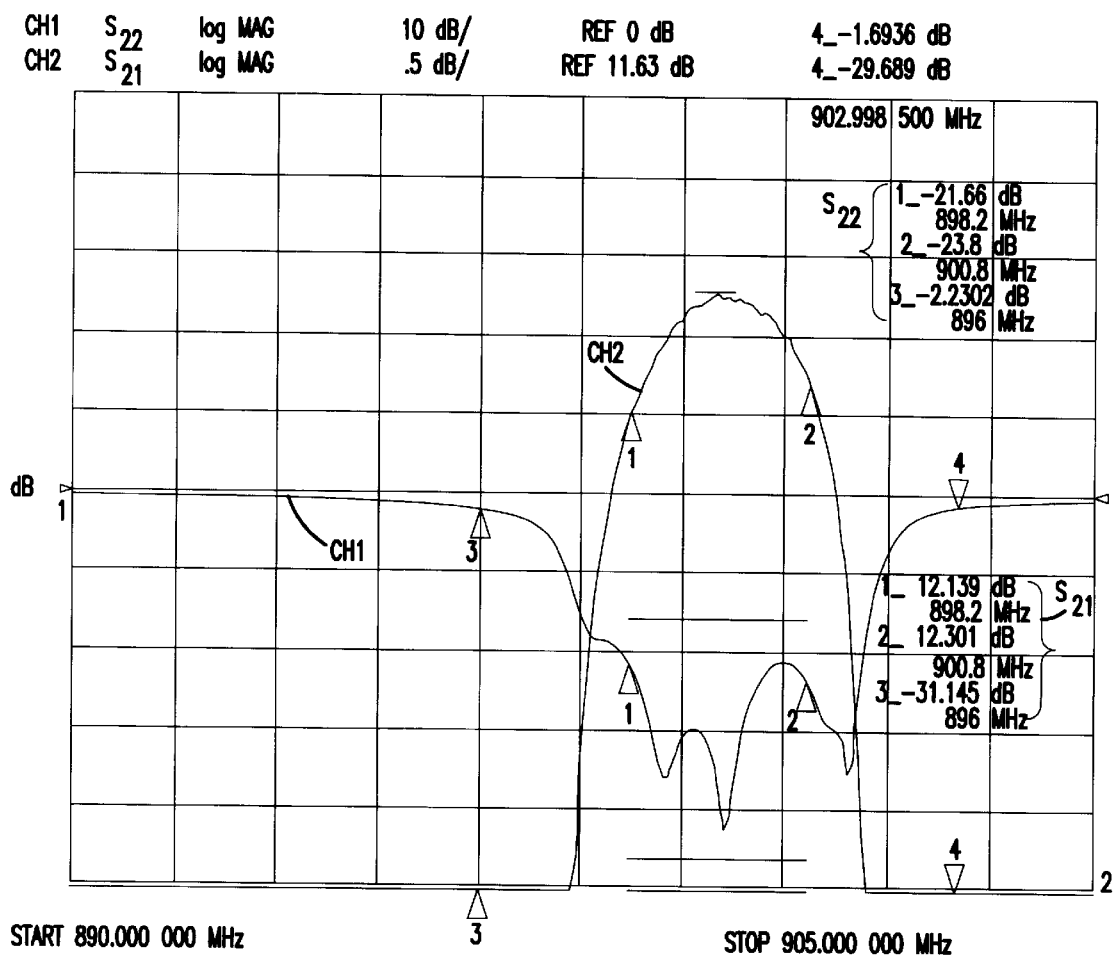
FIG. 6 is a graph that shows the ripple of an example system that does not include a coaxial resonator in accordance with the present invention.

FIG. 6 is a graph that shows the ripple of a filter arrangement, including an amplifier, in which the present invention is not used. The curve CH1 indicates the output return loss of an example filter arrangement, and curve CH2 shows the frequency response of the filter arrangement. The curves span a frequency range from 890 MHz to 905 MHz. Thus, each horizontal increment designates 1.5 MHz. For the output return loss curve CH1, each vertical increment is 10 dB beginning at 0 dB. For the frequency response, each vertical increment is 0.5 dB beginning at 11.63 dB.

As shown in the graph, the ripple in frequency response curve CH2 ranges from 12.139 dB at marker 1, to approximately 12.83 dB at the peak of frequency response curve CH2, to 12.301 dB at marker 2. Therefore, the ripple between marker 1 and the peak of frequency response curve CH2 is approximately equal to (12.83 dB−12.139 dB), or approximately 0.691 dB.

Figure 7:
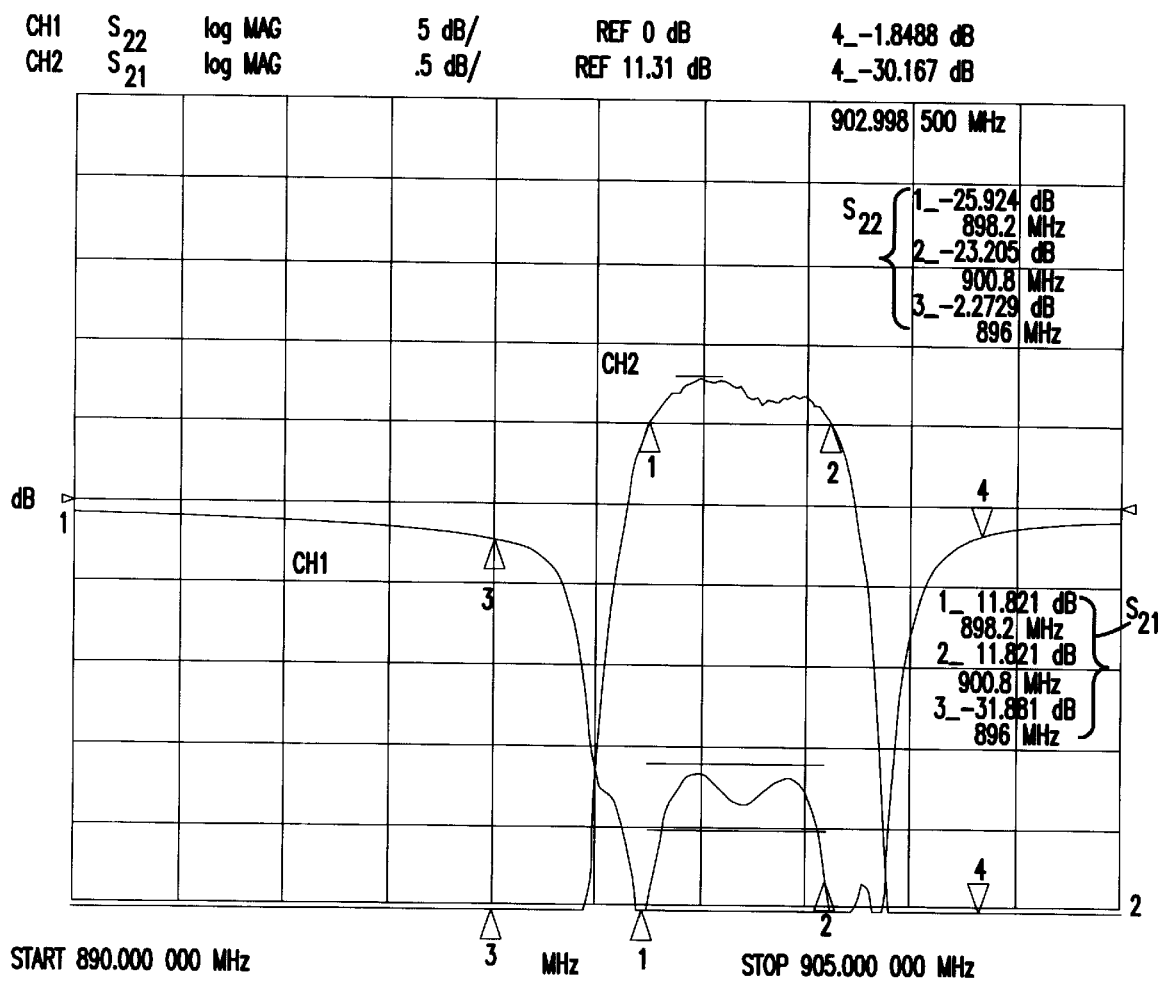
FIG. 7 is a graph that illustrates the ripple of an example system that includes a coaxial resonator in accordance with the present invention.

FIG. 7 is a graph that illustrates an output return loss curve and a frequency response curve for a filter arrangement in which the present invention is utilized. At marker 1, frequency response curve CH2 is 11.821 dB, and at marker 2, frequency response curve CH2 is 11.821 dB. The peak of frequency response curve CH2 is approximately 12.06 dB. Therefore, the ripple is approximately equal to (12.06 dB–11.821 dB), or approximately 0.239 dB. It has been discovered that introduction of the coaxial resonator in accordance with the present invention reduces the ripple by approximately 0.45 dB.

Accordingly, the present invention provides, among other aspects, a filtering arrangement and method providing a reduction in the fluctuation of the frequency response for the passband in a bandpass filter arrangement. Other aspects and embodiments of the present invention will be apparent to those skilled in the art from consideration of the specification and practice of the invention disclosed herein. It is intended that the specification and illustrated embodiments be considered as exemplary only, with a true scope and spirit of the invention being indicated by the following claims.

We claim:

1. A circuit arrangement for reducing passband ripple of a filter, comprising:

a signal amplifier having an output port and arranged to receive an input signal;

an electrical path coupled to the output port of the amplifier;

a bandpass filter coupled to the electrical path; and a coaxial resonator disposed a distance from the electrical path sufficient to reduce the ripple of the filter arrangement by a predetermined level, the coaxial resonator being physically disconnected from the electrical path.

2. The circuit arrangement of claim 1, wherein the bandpass filter is directly coupled to the amplifier with the electrical path.

3. The circuit arrangement of claim 1, wherein the coaxial resonator has a terminal, and the terminal of the coaxial resonator is disposed a predetermined distance from the electrical path, whereby the coaxial resonator is weakly coupled to the electrical path.

4. The circuit arrangement of claim 1, wherein the electrical path is a microstrip on a printed circuit board.

5. The circuit arrangement of claim 1, wherein the amplifier is a low noise amplifier.

6. The circuit arrangement of claim 1, wherein:

the coaxial resonator has a terminal, and the terminal of the coaxial resonator is disposed a predetermined distance from the electrical path, whereby the coaxial resonator is weakly coupled to the electrical path; and the amplifier is a low noise amplifier.

7. The circuit arrangement of claim 6, wherein the electrical path is a microstrip on a printed circuit board.

8. The circuit arrangement of claim 1, wherein the filter has a Q level between about 200 and 400, the electrical path has a characteristic impedance of approximately 50 Ohms, and approximately 0.4 mm separates the electrical path and the resonator.

9. A circuit arrangement for reducing passband ripple of a filter, comprising:

a signal amplifier arranged to receive an input signal;

a bandpass filter coupled to the amplifier and having an output port;

an electrical path coupled to the output port of the filter; and a coaxial resonator disposed a distance from the electrical path sufficient to reduce the ripple of the filter arrangement by a predetermined level.

10. A circuit arrangement for reducing passband ripple of a filter, comprising:

a signal amplifier arranged to receive an input signal;

a bandpass filter coupled to the amplifier, the filter having a recess; and a coaxial resonator having a terminal disposed within the recess of the filter and being electrically coupled to the bandpass filter for reducing the ripple of the filter arrangement by a predetermined level.

11. A circuit arrangement for reducing passband ripple of a filter, comprising:

an antenna;

a signal amplifier coupled to the antenna and having an output port;

an electrical path coupled to the output port of the amplifier;

a bandpass filter coupled to the electrical path;

a coaxial resonator disposed a distance from the electrical path sufficient to reduce the ripple of the filter arrangement by a predetermined level and being physically disconnected from the electrical path;

a voltage controlled oscillator;

a mixer coupled to the bandpass filter and to the voltage controlled oscillator, and arranged to provide an intermediate frequency; and an intermediate frequency amplifier coupled to the mixer.

12. The circuit arrangement of claim 11, wherein the coaxial resonator is weakly coupled to the electrical path.

13. The circuit arrangement of claim 11, wherein the coaxial resonator has a terminal, and the terminal of the coaxial resonator is disposed a predetermined distance from the electrical path, whereby the coaxial resonator is weakly coupled to the electrical path.

14. The circuit arrangement of claim 11, further comprising:

a duplexer coupled between the antenna and the signal amplifier; and a transmit amplifier coupled to the voltage controlled oscillator and arranged to receive transmit signals.

15. A circuit arrangement for reducing passband ripple of a filter, comprising:

an antenna;

a signal amplifier coupled to the antenna and having an output port;

a bandpass filter coupled to the amplifier and having an output port;

an electrical path coupled to the output port of the filter;

a coaxial resonator disposed a distance from the electrical path sufficient to reduce the ripple of the filter arrangement by a predetermined level and being physically disconnected from the electrical path;

a voltage controlled oscillator;

a mixer coupled to the bandpass filter and to the voltage controlled oscillator, and arranged to provide an intermediate frequency; and an intermediate frequency amplifier coupled to the mixer.

16. The circuit arrangement of claim 15, wherein the coaxial resonator has a terminal, and the terminal of the coaxial resonator is disposed a predetermined distance from the electrical path, whereby the coaxial resonator is weakly coupled to the electrical path.

17. The circuit arrangement of claim 9, wherein the coaxial resonator has a terminal, and the terminal of the coaxial resonator is disposed a predetermined distance from the electrical path, whereby the coaxial resonator is weakly coupled to the electrical path.

18. The circuit arrangement of claim 9, wherein the electrical path is a microstrip on a printed circuit board.

19. The circuit arrangement of claim 9, wherein the amplifier is a low noise amplifier.

20. The circuit arrangement of claim 9, wherein:

the coaxial resonator has a terminal, and the terminal of the coaxial resonator is disposed a predetermined distance from the electrical path, whereby the coaxial resonator is weakly coupled to the electrical path; and the amplifier is a low noise amplifier.

21. The circuit arrangement of claim 1, wherein the predetermined level of a passband ripple reduction is 0.7 dB.

22. The circuit arrangement of claim 10, wherein the predetermined level of a passband ripple reduction is 0.7 dB.

23. The circuit arrangement of claim 11, wherein the predetermined level of a passband ripple reduction is 0.7 dB.

24. The circuit arrangement of claim 15, wherein the predetermined level of a passband ripple reduction is 0.7 dB.

* * * * *